United States Patent [19]
Thepaut

[11] 3,975,691
[45] Aug. 17, 1976

[54] ACTIVE FREQUENCY FILTER CELLS
[75] Inventor: Pierre Thepaut, Lannion, France
[73] Assignee: Lignes Telegraphiques et Telephoniques, Paris, France
[22] Filed: June 20, 1975
[21] Appl. No.: 588,814

[30] Foreign Application Priority Data
July 30, 1974  France ............... 74.26408

[52] U.S. Cl. .................... 330/107; 330/126
[51] Int. Cl.² ............................ H03F 1/36
[58] Field of Search ............ 330/107, 109, 126; 328/167

[56] References Cited
UNITED STATES PATENTS
3,743,957  7/1973  Feistel .................. 330/107 X

*Primary Examiner*—James B. Mullins
*Attorney, Agent, or Firm*—Abraham A. Saffitz

[57] ABSTRACT

Active filter cells comprising dipoles formed by means of capacitors and resistors having a pair of input terminals and a pair of output terminals, with, in each pair, a grounded first terminal and a non-grounded second terminal. They comprise two elementary networks each of which including: an operational amplifier having first and second inputs, the first of which is connected to a reference potential, and an output; a first dipole connected between said second input terminal of the cell and said second input of said amplifier; a second dipole connected between said second input and said output of said amplifier; and a third dipole connecting said output of said amplifier to said second output terminal of the cell. At least one of said networks contains a fourth dipole connected by one of its terminals to said second input of one of said amplifiers and by its other terminal to said second output terminal of the cell. The above-described arrangement can be combined with a third amplifier, of the differential type, whose output constitutes the output of the cell.

5 Claims, 17 Drawing Figures $$f_1 \times f_2 = \frac{1}{4\pi^2}$$

$$\frac{1}{2\pi\sqrt{b}}$$

ACTIVE FREQUENCY FILTER CELLS

BACKGROUND OF THE INVENTION

1. Field of the Invention

The present invention, which relates to electric frequency filters used in telecommunication circuits, concerns filter cells whose transfer function expressed as a function of angular frequency is equal to the quotient of two polynomials of at least second degree.

2. Description of the Prior Art

Among the conventional active filter cells of this type, one of the simplest is the subject of the French patent No. 2,024,177 filed on Nov. 24th, 1969 by Western Electric Co. Inc. However, in solving certain special problems, this simplicity is not always retained. For instance, when the pass-band of the filter contains several regions separated by high attenuation frequencies, it is necessary to combine as many cells as there are regions of transmitted frequencies.

OBJECTS OF THE INVENTION

A first object of the present invention is to provide a cell whose pass-band is independent of the impedance connected to its output terminals.

A further object of the present invention is to provide a filter cell of specified infinite attenuation frequency.

Another object of the present invention is to provide a filter cell with several frequencies of infinite attenuation, controllable independently of each other.

CROSS REFERENCE TO RELATED APPLICATIONS

The present invention is an improvement to filter cells described in the U.S. patent application Ser. No. 552,798 filed by the Applicant on Feb. 25th, 1975 and now abandoned.

SUMMARY OF THE INVENTION

In a first embodiment, an active filter cell according to the present invention, comprising dipoles formed by means of resistors and capacitors, a pair of input terminals and a pair of output terminals, each pair having a first terminal grounded, contains two elementary networks, each of which consists of:
  a high-gain amplifier with two input terminals, the first of which is connected to a reference potential;
  a first dipole connected between the second input terminal of the cell and the second input of the amplifier;
  a second dipole connected between the second input terminal of the said amplifier and its output;
  a third dipole connected between the output of the amplifier and the second output terminal of the cell, at least one of the said networks having a fourth dipole connected by one terminal to the second input of one of the amplifiers and by the other to the second output terminal of the cell.

In a second embodiment, the two networks of the filter cell each contain a fourth dipole connected as previously stated.

In a third embodiment of the cell, the said other terminal of the fourth dipole is connected only to the negative input of a high-gain differential amplifier, the negative input of which is itself connected through a resistor to its output, which forms the second output terminal of the cell, whilst the positive input of this third amplifier is connected to a common point to the third dipoles of the two networks.

In a fourth embodiment, the two networks each contain a fourth dipole whose second terminal is connected to the negative input of the third amplifier.

According to a first feature of the invention, the components used for building the third dipoles are of different natures: one is a capacitor, the other a resistor.

According to another feature of the invention, the two elementary networks differ in the nature of the components forming the dipoles.

Since the cell according to the invention does not include an inductance, its realization in integrated form presents no special difficulty, as integrated circuits with two and three amplifiers are commercially available.

The cell with three amplifiers is of particularly simple application, as its transfer function is independent of the load impedance of the cell.

By applying the definition of the sensitivity of the cell in relation to its components given by L. P. HUELSMAN on page 14 of the book "Theory and Design of Active RC Circuits", published in 1968 by McGraw-Hill (N.Y.) it can be shown that:
  if the gain of the first or of the third amplifier is not infinite the zero transmission frequency remains unchanged;
  if the gain of the second amplifier is not infinite the dispersion of the zero transmission frequencies is of second order;
  if some components are taken equal, it is possible to nullify the sensitivity of quality coefficients and so to reduce the sensitivity of the transfer function ot the variations in components.

BRIEF DESCRIPTION OF THE DRAWING

Other features and advantages of the invention will become apparent in the course of the description, illustrated with FIGS. 1 to 13, which are given by way of non-limitative examples, and wherein.

DESCRIPTION OF THE PREFERRED EMBODIMENTS

Figure 1:
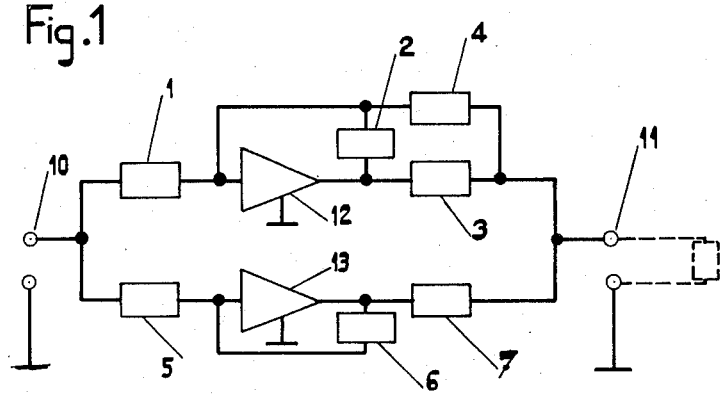
FIG. 1 represents the functional diagram of a first embodiment of a filter cell according to the invention.

FIG. 1 is a diagram of a filter cell according to the first embodiment of the invention. Between the input terminal 10 and the output terminal 11, the cell comprises a first network consisting of an amplifier 12 and dipoles numbered from 1 to 4, and a second network consisting of an amplifier 13, which is identical with 12 and connected in the same way as the latter, and dipoles numbered from 5 to 7. The amplifiers 12 and 13 may be of the operational type or else of the differential type. In the latter case, the positive inputs are connected to a reference potential and the negative inputs are connected to the network. The dipoles consist solely of resistors and capacitors without inductances. The effective operation of the amplifier 12 or 13 does, however, necessitate in each case a connection through a resistor between its output and its negative input. In the diagrams, every dipole consists of a single component, but this is not a limitation of the invention. More particularly, if more than one resistance or capacitor is used, calculations are performed in the same way, the only difference being that different expressions are used for the admittances of the dipoles.

The transfer function of the cell shown in FIG. 1 will be calculated with the following notation:

let $Y_n$ be the admittance of the dipole $n$;
let $E = e^{pt}$ be the voltage applied between the input terminals of the cell, $p$ being equal to $jW$, $W$ being the angular frequency, with $j = \sqrt{-1}$;
let $V_1$ and $V_2$ be the output voltages of the amplifiers 12 and 13;
let $S$ be the output voltage of the filter cell.

The rule of composition of the intensities applied to the inputs of the amplifiers 12 and 13 having an infinite gain allow one to write the relationship:

$$EY_1 = -V_1Y_2 - SY_4 \quad (1)$$

and $$EY_5 = -V_2Y_6 \quad (2)$$

If $Y_e$ is the admittance of the load connected to the output terminals of the cell, one may similarly write:

$$-SY_4 + (V_1 - S)Y_3 + (V_2 - S)Y_7 = SY_e \quad (3)$$

These equations allow the transfer function in its general form to be calculated:

$$F = \frac{S}{E} = -\frac{Y_1Y_3Y_6 + Y_2Y_5Y_7}{Y_2Y_6(Y_3 + Y_4 + Y_7) + Y_3Y_4Y_6 + Y_2Y_6Y_e} \quad (4)$$

In the case where $Y_e$ is small, the product $Y_2 Y_6 Y_e$ can be neglected.

Figure 2:
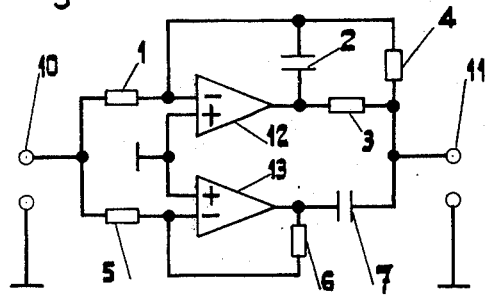
FIGS. 2a and 3a show a diagram of the cell according to the first embodiment.
FIGS. 2b and 3b show the frequency pass-band of the same.
Figure 2:
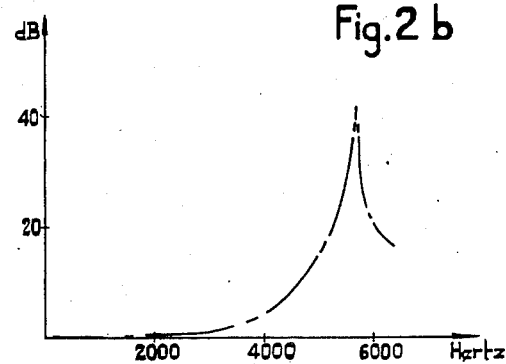
Figure 3:
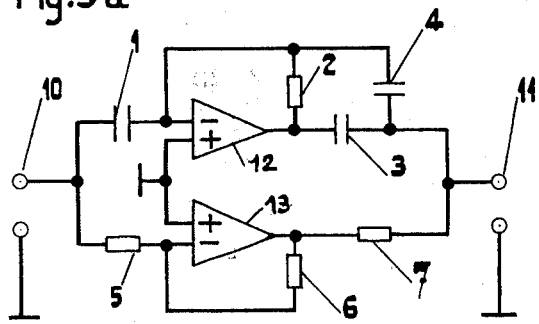
Figure 3:
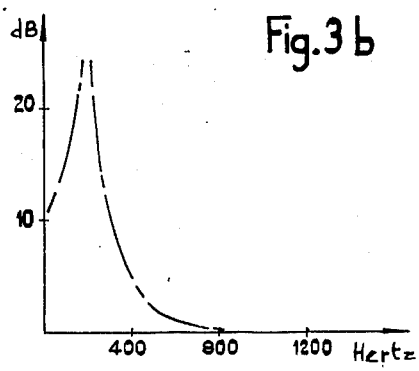

If the nature of the components is specified, as has been done in FIGS. 2a and 3a, it is possible to substitute their values for those of the admittances.

The transfer functions $F_2$ and $F_3$ of the cells shown in 2a and 3a have the same form which in Laplace's notation is $$F(p) = -K \frac{(p^2 + W_1^2)}{p^2 + (W_o/Q)p + W_o^2} \quad (5)$$

with, for example, for $F_2$:

$$K = \frac{R_1}{R_5}; \quad W_1^2 = \frac{R_5}{R_1} \cdot \frac{1}{(R_3C_2)(R_4C_7)} \quad (6)$$

$$W_o^2 = \frac{1}{(R_3C_2)(R_4C_7)}; \quad \frac{1}{Q^2} = \frac{R_3C_2}{R_4C_7}(1 + \frac{R_4}{R_3})^2 \quad (7)$$

$W_1$ is the zero transmission angular frequency (infinite attenuation frequency) and $W_o$ is substantially the angular frequency corresponding to the pole of the transfer function, as inasmuch as $4 Q^2 >> 1$; $W_o$ and $W_1$ include a ratio of resistances and two RC products. Thus it is preferable, with a view to decreasing their sensitivities to the values of the components, to adjust globally the said products and ratio to a fixed nominal value corresponding to each of these.

The same remark applies to the quality coefficients. In the case of FIGS. 2a and 3a, however, it is possible to put $R_3 = R_4$ for the former and $C_3 = C_4$ for the latter; the result of which is to reduce the sensitivity of the quality coefficient to the variations in the values of the components.

FIGS. 2b and 3b represent the variation curves of the functions $F_2$ and $F_3$ of the two cells for the particular values of the components.

Figure 4A:
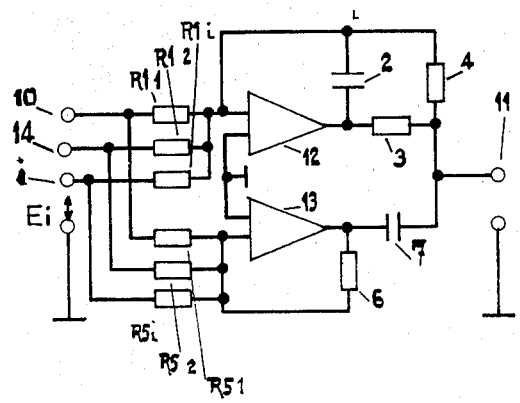
FIG. 4 shows in a the diagram of a cell of the type illustrated in FIG. 2a, provided with several input circuits, and in b the pass-band of this cell.
Figure 4B:
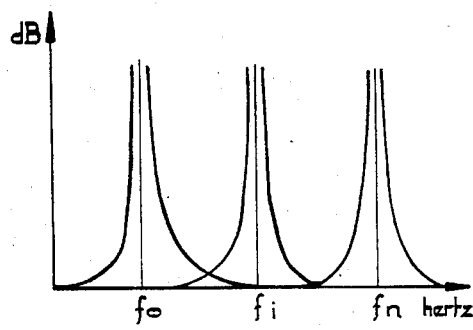

The function $F_2$ is shown for the following values:

$R_1 = 9\ 760$ ohms ; $R_5 = 53\ 600$ ohms ; $C_2 = 1$ nanofarad
$R_3 = 82\ 500$ ohms ; $R_6 = 53\ 600$ ohms ; $C_7 = 1$ nanofarad
$R_4 = 82\ 500$ ohms and the function $F_3$ for the following values:

$R_2 = 130\ 000$ ohms ; $R_6 = 14\ 300$ ohms ; $C_1 = 1$ nanofarad
$R_5 = 53\ 600$ ohms     $R_7 = 47\ 500$ ohms     $C_3 = 1$ nanofarad
                                                   $C_4 = 1$ nanofarad FIG. 4a is the diagram of a filter cell of the same type as is shown in FIG. 2a. Nevertheless, instead of a single input terminal 10, the diagram contains a plurality of inputs, such as 10, 14, . . . in any number $n$. An input of rank $i$ receiving a voltage $E_i$ is connected, on the one hand, to one end of a resistor $R_{1i}$, whose other end is connected to the negative input of the amplifier 12, and on the other hand to a resistor $R_{5i}$ whose other terminal is connected to the negative input of the amplifier 13.

If the values of the resistances $R_{1i}$ are equal to each other and the values of the resistances $R_{5i}$ are likewise equal to each other, the filter cell presents a single attenuation curve centered on a frequency $f_i$. Contrariwise, if the resistances have different values, there are $n$ independent values of the frequency $f_i$. By suitable choosing the values assigned to the pairs of resistances $R_{1i}$ and $R_{5i}$, and bearing in mind the algebraic relationship defining $F_2$, the $n$ frequencies of $f_i$ can be made equal to predetermined values $f_1 \ldots f_i \ldots f_n$. By applying a signal to an input of rank $i$ the central value $f_i$ of the attenuated band is simultaneously defined.

Figure 5:
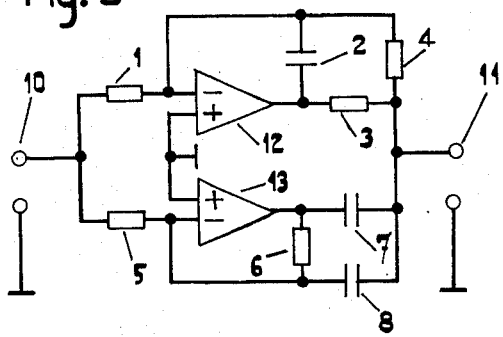
FIG. 5 shows a diagram of a cell according to a second embodiment.

FIG. 5 shows a filter cell where each of the two networks contains 4 dipoles. In this case, there is a third-degree term in the denominator of the transfer function, which assumes the general form:

$$F_5(p) = -\frac{p^2 + b_1}{p^3 + a_2p^2 + a_1p + a_o} \quad (8)$$

Figure 6:
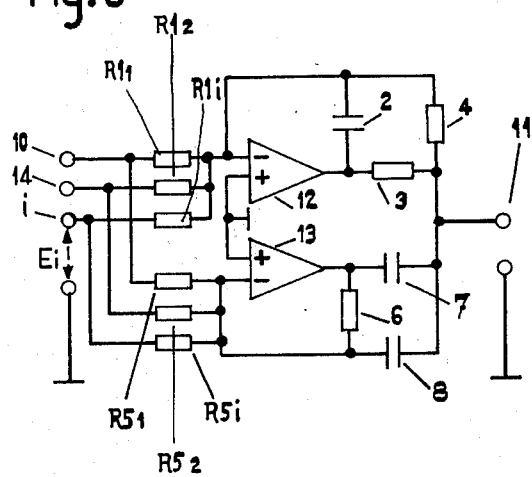
FIG. 6 shows a cell of the latter type with several inputs.

The diagram in FIG. 6 allows, taking that of FIG. 5 as the starting point, a filter cell to be produced having as many pass-bands as it has inputs.

Figure 7A:
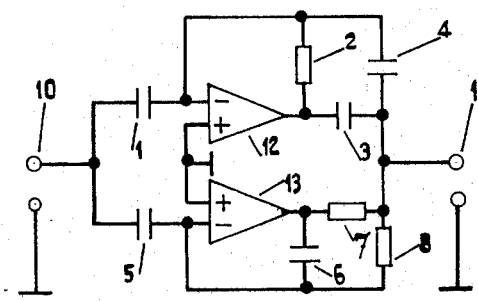
FIG. 7 shows in a a second diagram of the cell according to the second embodiment and in b its pass-band.
Figure 7B:
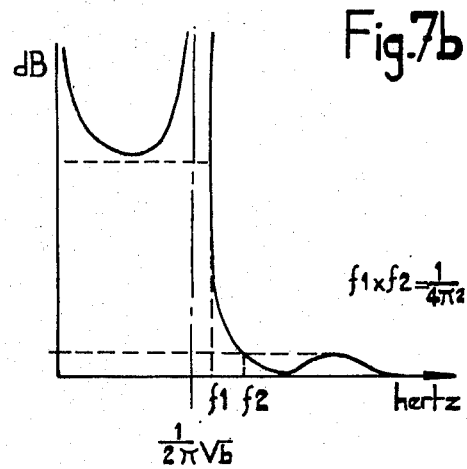

It is well known that if the resistors in FIG. 5 are replaced by capacitors the low-pass filter is transformed into a high-pass filter. This transformation is equivalent to replacing the resistors 1 and 5 of FIG. 5 by capacitors and permutating the positions of the components 2, 3, 4 with those of the components 6, 7, 8, as shown in FIG. 7a. The transfer function $F_7$ of this cell as a function of the coefficients of $F_5$ is:

$$F_7(p) = -\frac{p(1 + b_1 p^2)}{1 + a_2 p + a_1 p^2 + a_0 p^3} \qquad (9)$$

Figure 8:
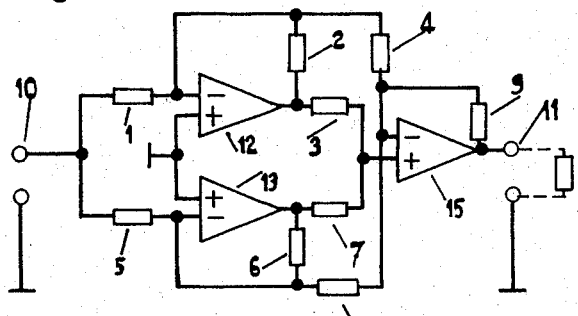
FIG. 8 represents the operational diagram of a third embodiment of a filter cell.

FIG. 8 shows the general connection diagram of a third embodiment of a filter cell according to the invention. This comprises, in addition to the elements of the first embodiment, i.e. the two high-gain amplifiers 12 and 13 and the seven dipoles connected as already explained in connection with FIG. 1, a third high-gain amplifier of the differential type 15 whose output is connected to the output terminal 11 of the cell, a dipole 9 connected between the output terminal 11 of the amplifier 15 and a dipole 8 connected between the negative input of the amplifier 13 and the negative input of the amplifier 15. Unlike the diagram of the first embodiment, the dipole 4 is connected between the negative inputs of the amplifiers 12 and 15; further, the positive input of the amplifier 15 is connected to the common point to the dipoles 3 and 7.

The transfer function is calculated by the method already set forth above, by assuming that the gain of the amplifier 15 is infinite and by bearing in mind that the voltages between the negative inputs of 12 and 13 are negligible, and that the voltages at the two inputs of 15 are substantially equal, because the input impedances of the amplifiers 12, 13 and 15 are very low.

The algebraic expression for the transfer function $F_8$ of the cell is:

$$F_8 = -\frac{Y_4 + Y_8 + Y_9}{Y_9} \cdot \frac{Y_1 Y_3 Y_6 + Y_2 Y_5 Y_7}{Y_2 Y_6 (Y_3 + Y_7) + Y_3 Y_4 Y_6 + Y_2 Y_7 Y_8} \qquad (10)$$

In this case, where $Y_4$, $Y_8$ and $Y_9$ are conductances, the first term is a number whose value can be adjusted in large limits as a function of the ratio $(Y_4 + Y_8)/Y_9$.

If the admittance $Y_9$ of the ninth dipole is high, the first fraction appearing in the transfer function is equal to unity and, taking into account that the output admittance is closed to $Y_9$, the expression for the transfer function of the filter cell contains neither $Y_9$ nor the output admittance.

Figure 9:
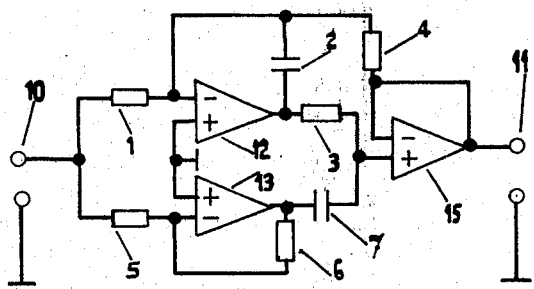
FIGS. 9 and 10 each show a diagram of a cell according to a third embodiment of the filter cell.
Figure 10:
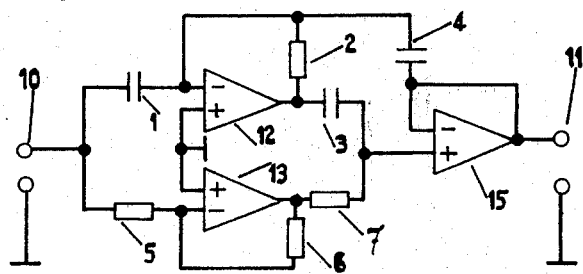

FIGS. 9 and 10 show two diagrams in which the dipole 9 is replaced by a short-circuit in application of this remark; moreover, the dipole 8 is suppressed. Owing to this, the transfer functions $F_9$ and $F_{10}$ assume the form already encountered in connection with $F_2$ and $F_3$. In particular, the pass-band of the cell represented in FIG. 9 is identical with that of FIG. 2b is the components are given the following values:

| ohms | nanofarads |
|---|---|
| $R_1 = 19\ 600$ | $C_2 = 1$ |
| $R_2 = 41\ 200$ | $C_7 = 1$ |
| $R_3 = 31\ 600$ | |
| $R_5 = 53\ 600$ | |

| -continued | |
|---|---|
| ohms | nanofarads |
| $R_6 = 53\ 600$ | | while the pass-band of the cell represented in FIG. 10 is identical with that of FIG. 3b if the components are given the following values:

| ohms | nanofarads |
|---|---|
| $R_2 = 64\ 900$ | $C_1 = 1$ |
| $R_5 = 53\ 600$ | $C_3 = 1$ |
| $R_6 = 14\ 300$ | $C_4 = 1$ |
| $R_7 = 95\ 300$ | |

Figure 11:
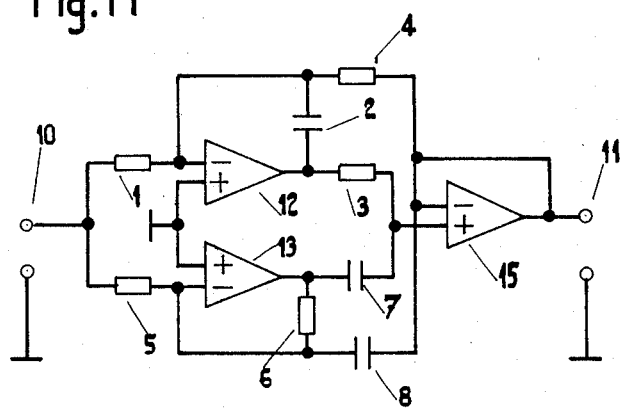
FIG. 11 is a diagram of a special cell with three amplifiers, including two complete networks.

FIG. 11 shows the diagram of a filter cell with two complete networks of three amplifiers where the dipole 9 is replaced by a short-circuit. Its transfer function does not contain the second fraction appearing in the expression given for $F_8$.

Figure 12:
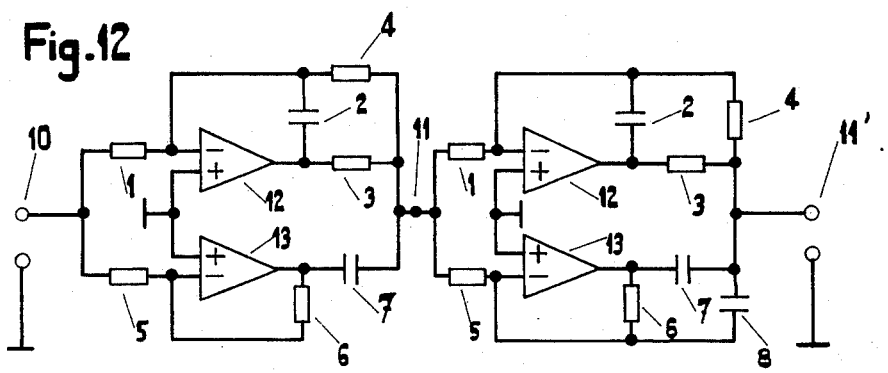
FIG. 12 is a diagram of a filter according to the first embodiment of the invention, with two cells connected in cascade.

FIG. 12 represents a filter with two cells according to the two first embodiments of the invention. The transfer function of the filter, equal to the product of the transfer functions of the two cells, taking into account that the admittances are placed in parallel at their respective output terminals, is:

$$F_{12}(p) = K \frac{(p^2 + b_1)(p^2 + b_2)}{(p^2 + a_1 p + a_2)(p^2 + a_3 p + a_4)(p + a_5)} \qquad (11)$$

Figure 13:
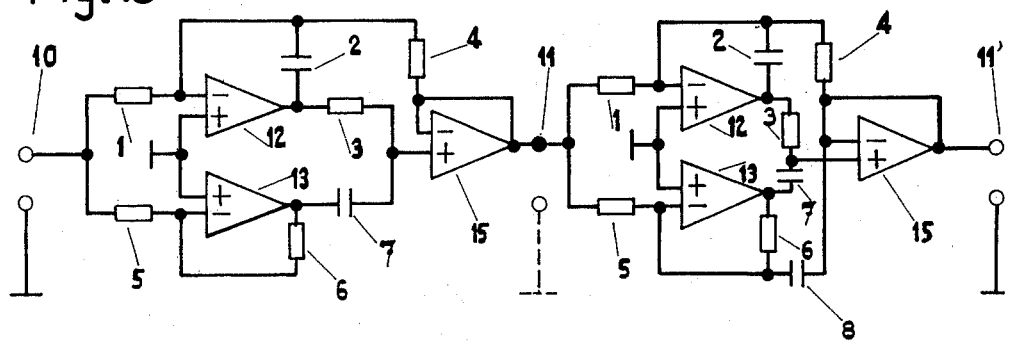
FIG. 13 is a diagram of a filter according to the two last embodiments of the invention, with two cells connected in cascade.

In the cascade mounting shown in FIG. 13, carried out by means of cells with three amplifiers as those represented in FIGS. 9 to 11, the output impedance of each cell is very low, and the perturbation of the pass-band of one cell caused by the next cell or by the consumer circuit is negligible.

What I claim is:

1. An active filter cell comprising dipoles formed by means of capacitors and resistors and having a pair of input terminals and a pair of output terminals, with, in each pair, a grounded first terminal and a non-grounded second terminal, and which comprises two elementary networks each of which including:
   a very high-gain amplifier having an output and first and second inputs, the first of which is connected to a reference potential;
   a first dipole connected between said second input terminal of the cell and said second input of said amplifier;
   a second dipole connected between said second input of said amplifier and said output of said amplifier; and
   a third dipole connecting said output of said amplifier to a common terminal to both said networks;
said cell further comprising:
   a third high-gain amplifier of the differential type having a negative input and a positive input, said negative input being connected through a fourth dipole to the non-grounded input of one of the amplifiers of said networks, and by means of a further connection to the output of said third amplifier, and said positive input being connected to said common terminal.

2. A filter cell according to claim 1, wherein said further connection is a resistant connection.

3. A filter cell according to claim 1, in which said further connection if a direct connection.

4. A filter cell according to claim 1, wherein a fifth dipole connects said negative input of said third amplifier to the non-grounded input of the other one of the amplifiers of said networks.

5. An active filter cell comprising dipoles formed of capacitors and resistors, said filter cell having a number $n$ pairs of input terminals and a pair of output terminals, with a grounded first terminal and a non-grounded second terminal in each of said pairs and two elementary networks, each of which includes:

- a very high gain amplifier having a first input, a second input and an output, said first input being connected to a reference potential;
- a second dipole connected between said second input and said output of said amplifier; and
- a third dipole connecting said output of said amplifier to said second output terminal of said cell;
- at least one of said networks containing a fourth dipole connected by one of its terminals to said second input of the amplifier included in said one of said networks and by its other terminal to said second output terminal of said cell; each one of said $n$ inputs being connected by a first resistor having a first resistance value to said non-grounded input of one of said amplifiers and by another resistor having a second resistance value to the second input of the other of said amplifiers, whereby the obtained active filter cell has maximum attenuation at a number $n$ of different frequencies depending on each said first and second resistance values of said resistors.

* * * * *